United States Patent
Matsuoka

(10) Patent No.: US 7,224,618 B2
(45) Date of Patent: May 29, 2007

(54) NONVOLATILE SEMICONDUCTOR MEMORY DEVICE WITH ERASE VOLTAGE MEASUREMENT

(75) Inventor: Nobuaki Matsuoka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/183,032

(22) Filed: Jul. 15, 2005

(65) Prior Publication Data

US 2006/0013043 A1    Jan. 19, 2006

(30) Foreign Application Priority Data

Jul. 16, 2004    (JP)    ............... 2004-209353

(51) Int. Cl.
  *G11C 11/34*    (2006.01)
  *G11C 16/04*    (2006.01)
(52) U.S. Cl. ........................ 365/185.29; 365/185.18; 365/185.21
(58) Field of Classification Search ........... 365/185.29, 365/185.18, 185.21
See application file for complete search history.

(56) References Cited

U.S. PATENT DOCUMENTS

| 5,097,446 | A | * | 3/1992 | Shoji et al. ............ 365/185.12 |
| 5,245,570 | A |  | 9/1993 | Fazio et al. |
| 5,424,979 | A | * | 6/1995 | Morii .................... 365/185.28 |
| 5,615,154 | A | * | 3/1997 | Yamada ................. 365/185.22 |
| 7,046,559 | B2 | * | 5/2006 | Saito ..................... 365/185.33 |

FOREIGN PATENT DOCUMENTS

JP    6-215587 A    8/1994

* cited by examiner

*Primary Examiner*—Amir Zarabian
*Assistant Examiner*—Kretelia Graham
(74) *Attorney, Agent, or Firm*—Morrison & Foerster LLP

(57) ABSTRACT

A nonvolatile semiconductor memory device is provided comprising a plurality of memory cell arrays, each of which consists mainly of sidewall type memory cells arranged in a matrix, the memory cell having a MOSFET structure where memory functional element for holding charges are provided on both sides of a gate electrode. The memory cell array is divided into sectors. The memory device further comprises a sector selecting circuit for, when one of the memory cell arrays is to be erased collectively, sequentially selecting at most a predetermined number of the sectors at a time from the memory cell array to be erased, and an erase voltage applying circuit for, when the collective erasing action is carried out, applying a predetermined level of erasing voltage to the sectors selected at once by the sector selecting circuit.

8 Claims, 9 Drawing Sheets

NONVOLATILE SEMICONDUCTOR MEMORY DEVICE WITH ERASE VOLTAGE MEASUREMENT

CROSS REFERENCE TO RELATED APPLICATION

This Nonprovisional application claims priority under 35 U.S.C. §119(a) on Patent Application No. 2004-209353 filed in Japan on Jul. 16, 2004, the entire contents of which are hereby incorporated by reference.

BACKGROUND OF THE INVENTION

1. Field of the Invention

The present invention relates to a nonvolatile semiconductor memory device which comprises one or more memory cell arrays erasable collectively in response to a command input from the outside, each memory cell array having a plurality of a sidewall type memory cell arranged in a matrix form of rows and columns and each sidewall type memory cell comprising a gate electrode formed over a semiconductor layer via a gate insulating film, a channel region disposed below the gate electrode, diffusion regions disposed on both sides of the channel region and having a conductive type opposite to that of the channel region, and a memory functional element formed on either both or one side of the gate electrode and having the function of retaining charges. More particularly, the present invention relates to a method of erasing the data in a nonvolatile semiconductor memory device.

2. Description of the Related Art

A common erasable programmable read only memory (EPROM) incorporates a memory cell of a metal-oxide-semiconductor (MOS) structure with an electrically insulated floating gate. The data of interest is stored in the memory cell according to the amount of charges at the floating gate. A flash memory is one type of the EPROMs. The flash memory typically has a memory cell array structure similar to the EPROM. The memory cell array is consisted of word and column. Each memory cell is located at the intersection between a word line and a bit line. The word line is connected to the control gates of memory cells arranged along each row while the bit line is connected to the drains of memory cells arranged along each column. All the memory cells are connected at the source to a common source line. The flash memory can be programmed by a user. Once the flash memory has been programmed, it holds a programmed data before an erasing action is called. When the flash memory is applied at its source with an erasing voltage, the data throughout its memory cell array can be erased. After the erasing action, the flash memory remains programmable with a new data.

Such a conventional flash memory is however unfavorable in the erasing property of the memory cell array. When a program code or data stored in the memory cell array is modified partially or entirely, it has to be completely rewritten by a modified version of the program code or data with the memory cell array cleared off thoroughly.

For eliminating such a drawback, the conventional flash memory is modified to employ a method of dividing the memory cell array into blocks and erasing desired one of the blocks through applying an erasing voltage to the source of the memory cells in the block. The block erasing method allows one target block in the memory cell array but not all the memory cell array to be erased selectively. For example, a nonvolatile semiconductor memory device employing the method is disclosed in Japanese Patent Laid-open Publication NO. 6-215587.

As flash memories gain a large share in the market of nonvolatile semiconductor memory devices, flash memory compatible types of nonvolatile semiconductor memory devices are now introduced. One of them is a sidewall type. The sidewall type of nonvolatile semiconductor memory devices is a multi-bit memory capable of storing two bits in each memory cell and its memory cell size is smaller than that of flash memories, thus being favorable in the higher integration. Also, as the sidewall type is based on a logic process (a manufacturing process for logic circuits), its manufacturing cost is relatively lower than that of flash memories. A sidewall type memory cell used in the sidewall type of nonvolatile semiconductor memory devices will now be explained in more detail, referring to FIG. 3.

The sidewall type memory cell has a gate electrode 217 provided via a gate insulating layer 214 on a P-type semiconductor substrate 211 thereof A pair of N-type diffused regions 212 and 213 acting as source or drain areas are developed on both sides of the gate electrode 217 on the P-type semiconductor substrate 211. The diffused regions 212 and 213 are arranged in an offset form. More specifically, the diffused regions 212 and 213 extend short of beneath the gate electrode 217 while each offset region 271 beneath a charge holding layer forms a part of the channel region. A silicon nitride layer 242 is provided as the charge holding layer for holding charges at the trap level on each side of the gate electrode 217 and sandwiched between two silicon oxide layers 241 and 243 thus forming an ONO structure of the sidewall. The silicon nitride layer 242 functions as a memory functional element for holding charges. The memory functional element refers to a part in which charges are actually accumulated by rewriting operation in the memory functional element or the charge retaining film.

The charge holding regions (the silicon nitride layer 242) in each of the memory sections 261 and 262 are overlapped with the diffused regions 212 and 213 respectively. The overlapping allows at least portions of the charge holding layer (the silicon nitride layer 242) to extend above at least the portions of the diffused regions 212 and 213.

The above described structure is featured not to permit over erasing. The over erasing means to lower the threshold voltage from its lower limit to be controlled. For example, a NOR flash memory may have the threshold voltage declined to not higher than 0 V by the over erasing. When the threshold voltage has been declined to lower than 0 V, a potential difference between the source and the drain will cause a flow of current with no application of a positive voltage at the control gate in the NOR flash memory. It is hence hardly distinguished between the readout action of measuring the current across a target or selected memory cell of which the control gate is supplied with a positive voltage and the readout action of measuring the current across an unselected memory cell where the over erasing is done. As a result, the data to be output will be lowered in the reliability.

The controlling of the threshold voltage will now be explained. A data stored in a flash memory is expressed by the amount of charges (electrons) received by the floating gate. More particularly, when the floating gate retains a greater number of electrons, the channel region will hardly develop an inversion layer, thus increasing the threshold voltage at the memory cell. On the other hand, when the floating gate releases electrons, the channel region will be allowed to develop an inversion layer thus decreasing the threshold voltage at the memory cell. In short, the state of the channel region in a flash memory directly depends on the number of retained electrons. However, in the sidewall memory described above, the gate electrode 217 is provided via the gate insulating layer 214 on the P-type semiconductor substrate 211, of which the structure is identical to that of an N-type MOSFET. Accordingly, the threshold voltage for the N-type MOSFET is at least compensated even when the memory section in the sidewall memory is overloaded with electrons and will never be declined to not higher than 0 V. This is the reason why the sidewall memory involves no over erasing and hence needs not to carry out a sequence of troublesome erasing actions including pre-conditioning process and post-conditioning process which are mandatory in a NOR flash memory for inhibiting the over erasing. The pre-conditional process is a programming action prior to the erasing process at a target memory cell for eliminating variations in the threshold voltage, whereby the target memory cell of which the threshold voltage is low can be protected from being over erased. The post-conditioning process is a moderate programming action of increasing the threshold voltage at a target memory cell which tends to become lower in the threshold voltage than the other memory cells after the erasing action.

It is desired that any nonvolatile semiconductor memory device of the sidewall type arranged compatible with a flash memory matches the specifications of the flash memory. This allows the sidewall memory to replace a flash memory without modifying the primary design of a system where the flash memory was installed. For example, the function of erasing data in each block is systematically contained in every known flash memory and will thus preferably be supported by the sidewall memory. Also, as the sidewall memory is designed to replace a flash memory, its performance should be advantageous over the flash memory, i.e., the erasing action is conducted at a higher speed.

However, the sidewall type memory cell is arranged to depend on which of the memory sections 261 and 262 is to be programmed, erased, or read with an electric field applied in one direction across the channel region. Therefore, the assignment of the diffused regions 212 and 213 is variable as the source and the drain respectively or vice versa. Accordingly, the sidewall memory unlike a flash memory needs not to connect the source of each memory cell with the common source line for erasing data on the block-by-block basis. Moreover, the block-by-block basis may be unfavorable in view of the energy saving.

In the sidewall memory, each memory cell is erased by a hot-hole implanting technique using the effect of inter-band tunneling. The inter-band tunneling is induced by a high-level reversed voltage applied to the PN junction between the substrate and the drain and a negative voltage applied to the gate for increasing the sharpness at the PN junction. More particularly, the erasing action of the sidewall type memory cell is substantially based on breakdown at the PN junction. Accordingly, the (erasing) current running from the memory cell for erasing data in the sidewall memory is greater than in the flash memory. More specifically, the current is substantially 100 nA per memory cell.

It is now assumed that the data is erased at once from each block which comprises 512 K (512×1024) memory cells. As each memory cell stores two bits, the storage capacity of the block is 1 M bits. When each of the 512 K memory cells draws 100 nA, the current of 50 mA is needed for erasing the block. It is hence required for collectively erasing data to increase the current supplying capacity of a voltage supplying circuit (namely, a charge pump circuit), the amplitude of voltage for offsetting a drop down in the voltage due to the current increase, or the size of a transistor which may be declined in the voltage during the erasing action. Those requirements will disadvantageously increase the current consumption and the overall chip area.

Also, with the fact that the charge pump circuit in a common flash memory delivers 1 mA of current at minimum, the total current of 50 mA for collective erasing will rarely be feasible. In other words, even when the sidewall memory is highly integrated to such a scale as of a flash memory, its action of erasing each block will hardly be implemented at the same performance as of the flash memory. It is hence needed an improved method of the sidewall memory erasing data at once in each block with highly integrated at the flash memory level. As the sidewall memory intends to replace a flash memory, its erasing action has to speed up as fast as the flash memory.

SUMMARY OF THE INVENTION

The present invention has been developed in view of the foregoing drawbacks and its object is to provide a nonvolatile semiconductor memory device which comprises a plurality of memory cell arrays, of which the memory cell is of a sidewall type, for erasing blocks of the memory cells at once as equal to a flash memory.

A nonvolatile semiconductor memory device according to the present invention comprises one or more memory cell arrays erasable collectively in response to a command input from the outside, each memory cell array having a plurality of a sidewall type memory cell arranged in a matrix form of rows and columns and each sidewall type memory cell comprising a gate electrode formed over a semiconductor layer via a gate insulating film, a channel region disposed below the gate electrode, diffusion regions disposed on both sides of the channel region and having a conductive type opposite to that of the channel region, and a memory functional elements formed on either both or one side of the gate electrode and having the function of retaining charges. The nonvolatile semiconductor memory cell further comprises a sector selecting circuit for, when one of the memory cell arrays is to be erased collectively, sequentially selecting at most a predetermined number of the sectors at a time from the memory cell array to be erased, and an erase voltage applying circuit for, when the collective erasing action is carried out, applying a predetermined level of erasing voltage to the sectors selected at once by the sector selecting circuit.

As featured, the memory cell array can be erased as one unit (block erasing) where one or more of the sectors are erased in a time-division manner. Hence, even when the memory cell array is significantly large in the size, the size of each sector (the total of memory cells in the sector) to be erased at once remains at a limited number. Accordingly, the erasing current consumed at once can be minimized, allowing the effect of block erasing, even if the size of a unit data for block erasing is large, to be equal to that of a flash memory. Also, the sidewall type memory cell is erasable at a higher speed in cell unit than a flash memory while producing theoretically no over-erasing and thus requiring no extra step of offsetting the effect of over-erasing in the sequential steps for the erasing action. Accordingly, even when the number of sectors is increased, the block erasing proceeds at a higher speed than that of a flash memory. As a result, the nonvolatile semiconductor memory device of the present invention can replace any conventional flash memory without changing the application of a system based on the flash memory while ensuring a higher level of the performance.

It is noted that the collective erasing in this specification means erasing the memory cells collectively as one unit but not necessarily limited erasing all the memory cells in the memory cell array at the same time.

The nonvolatile semiconductor memory device of the present invention may be modified further comprising a current supplying capacity detecting circuit for measuring a current supplying capacity of the erase voltage applying circuit which generates a predetermined level of the erasing voltage, and wherein the sector selecting circuit is arranged to select a desired number of the sectors which is variable at the maximum corresponding to the current supplying capacity of the current supplying capacity detecting circuit. Preferably, the current supplying capacity detecting circuit may be arranged to measure the current supplying capacity from the source voltage received by the erase voltage generating circuit.

As featured, the sectors can be erased at the maximum size with the erasing current which is supplied within the range of the current supplying capacity, corresponding to the measurement of the current supply determined by the current supplying capacity detecting circuit. As the number of actions for erasing at a time-division manner is decreased, the overall erasing time can be minimized. With the erase voltage generating circuit implemented by a charge pump circuit, the current supplying capacity can easily be determined from the source voltage, thus minimizing the overall erasing time with a simple arrangement.

The nonvolatile semiconductor memory device of the present invention may be modified in which the sector selecting circuit is arranged to select a number of the sectors at once in response to an address signal or an output signal from an internal register.

As featured, the memory cell array can be erased by assigning the sectors with their respective addresses and selectively erasing the sectors in a succession in the memory cell array with the use of an address signal. Also, desired sectors in the memory cell array can selectively be erased with the use of a control signal from the internal register regardless of the address signal. Accordingly, when some sectors remain not erased after the erasing action over the memory cell array, they can selectively be accessed and subjected to a repeat of the erasing action.

The nonvolatile semiconductor memory device of the present invention may also be modified in which the memory cell array consists of the sectors divided equally in a size.

As featured, the sector selecting circuit is simplified in the arrangement. Also, when two or more of the sectors are to be erased, the number of memory cells to be erased is equal between the sectors. This can make the erasing voltage uniform throughout the block erasing action.

The nonvolatile semiconductor memory device of the present invention may be modified further comprising an erase verifying circuit for examining whether all the memory cells have been erased or not in each selected sector applied with the predetermined level of erasing voltage, and wherein when one or more of not erased sectors in which one or more of the memory cells remains not erased are detected by the erase verifying circuit, the sector selecting circuit sequentially selects at most the predetermined number of not erased sectors at a time and then the erase voltage applying circuit applies the predetermined level of erasing voltage to each group of the not erased sectors selected at a time by the sector selecting circuit. Also, the nonvolatile semiconductor memory device may be modified in which the erase verifying circuit is arranged to conduct its verifying action over the not erased sectors which have been applied with the predetermined level of erasing voltage from the erase voltage applying circuit.

As featured, not erased sectors left after the initial erasing action (with application of the predetermined level of erasing voltage) are detected by the verifying process and can thus be subjected as units to the second erasing action which is thus speeded up. Hence, the entire erasing action until all the sectors in the memory cell array of interest have been erased will be minimized in the time consumption. Also, if not erased sectors are found by the verifying process after the second erasing action, they can successively be subjected in units to the second erasing action which is thus speeded up. Accordingly, the entire erasing action until all the sectors in the memory cell array of interest have been erased will be minimized in the time consumption.

The nonvolatile semiconductor memory device of the present invention may be modified further comprising an internal register for storing a result of the verifying action over each sector, and wherein the erase verifying circuit is arranged to store the result of the verifying action over each sector in the corresponding location in the internal register, and the sector selecting circuit is arranged to select the not erased sectors in response to an output of the internal register.

As featured, the not erased sectors determined after the verifying process can selectively be accessed and subjected to the second and further erasing actions, whereby the overall erasing action will be minimized in the time consumption.

DETAILED DESCRIPTION OF THE INVENTION

One embodiment of the present invention will be described in the form of a nonvolatile semiconductor memory device (referred to as an inventive device hereinafter), referring to relevant drawings.

Figure 1:
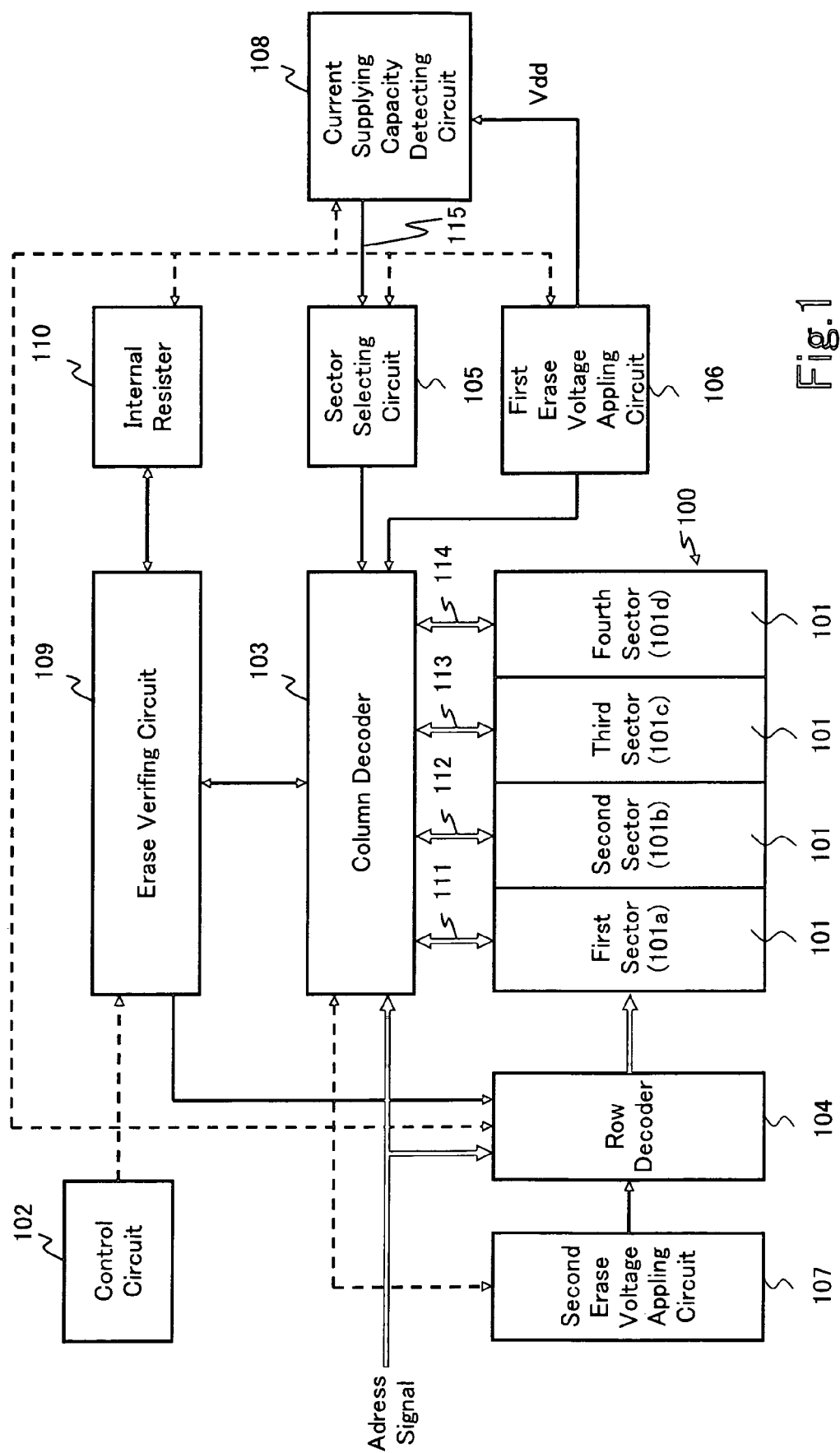
FIG. 1 is a block diagram schematically showing one embodiment of a nonvolatile semiconductor memory device according to the present invention.

FIG. 1 is a schematic block diagram of the inventive device. Shown in FIG. 1 is a circuit block of the inventive device for conducting an erasing action. The inventive device comprises a group of memory cell arrays 100, each array consisting mainly of sidewall type memory cells (referred to as memory cells hereinafter) arrayed in a matrix form having rows and columns. FIG. 1 illustrates one memory cell array 100 for simplification. The memory cell array 100 is divided into a plurality of sectors 101. Four of the sectors 101 separated uniformly along a column are shown in FIG. 1 while the sectors in each memory cell array 101 are not limited to the number and the direction of division in the embodiment. As the memory cell array 100 in the inventive device is selected with an erase command which has been entered by a user, its data is erased in a user mode (user operable action mode) determined by the erase command.

As shown in FIG. 1, the inventive device further comprises a control circuit 102 for controlling a sequence of erasing actions, a column decoder 103 for selecting one or more columns of the memory cells in each memory cell array 100, a row decoder 104 for selecting one or more rows of the memory cells in each memory cell array 100, a sector selecting circuit 105 for selecting desired ones of the sectors 101 in the memory cell array 100, two, first and second, erase voltage applying circuits 106 and 107 for generating two types of erase voltage, a current supplying capacity detecting circuit 108 for detecting the current supplying capacity of the first erase voltage applying circuit 106, an erase verifying circuit 109 for conducting a verifying action of examining whether all the memory cells in each sector have been erased or not, and an internal register 110 for saving a result of the verifying action in each sector.

Figure 2:
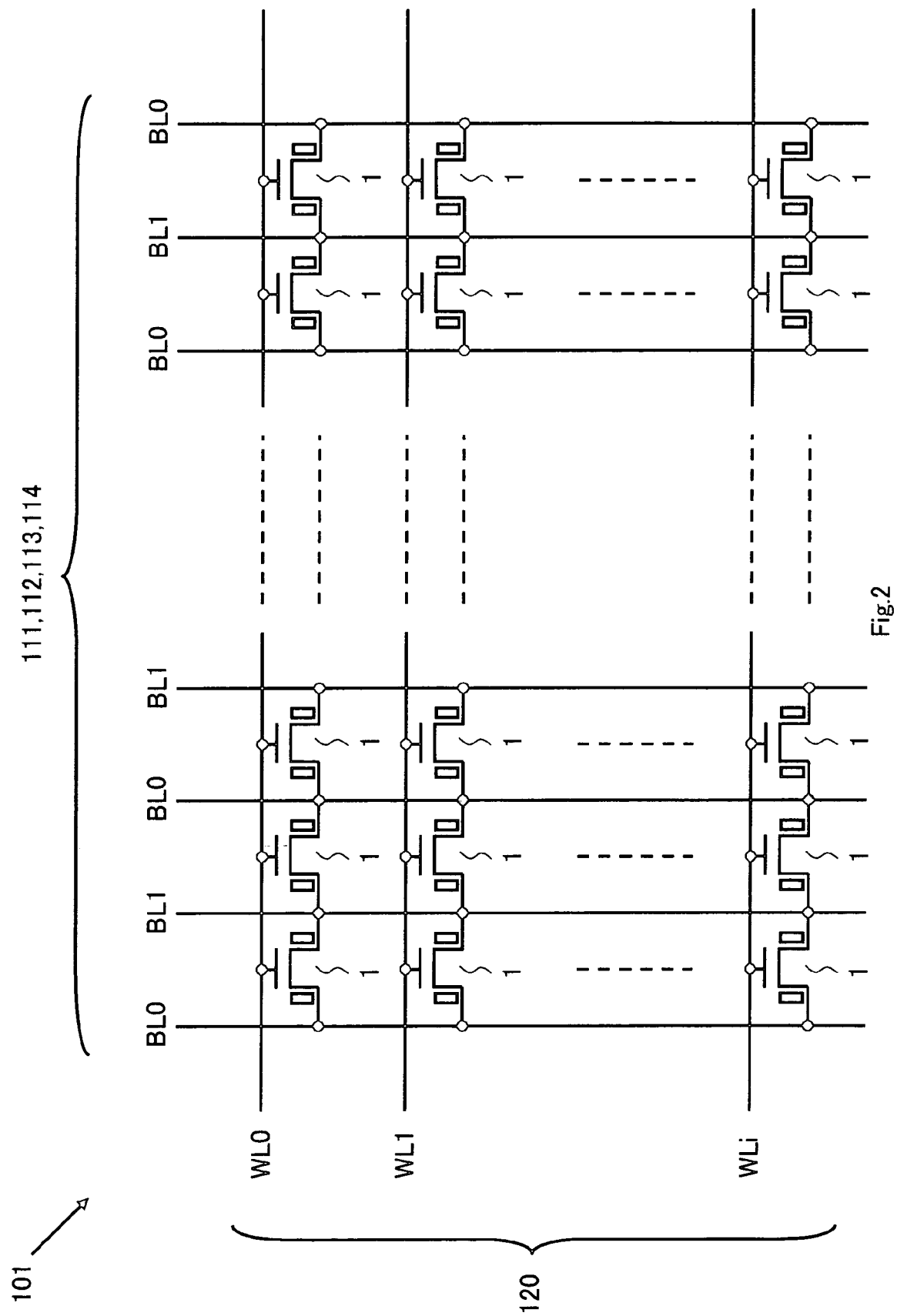
FIG. 2 is a circuitry diagram showing a part of the arrangement of memory cells in each sector to form a memory cell array of the nonvolatile semiconductor memory device according to the present invention.
Figure 3B:
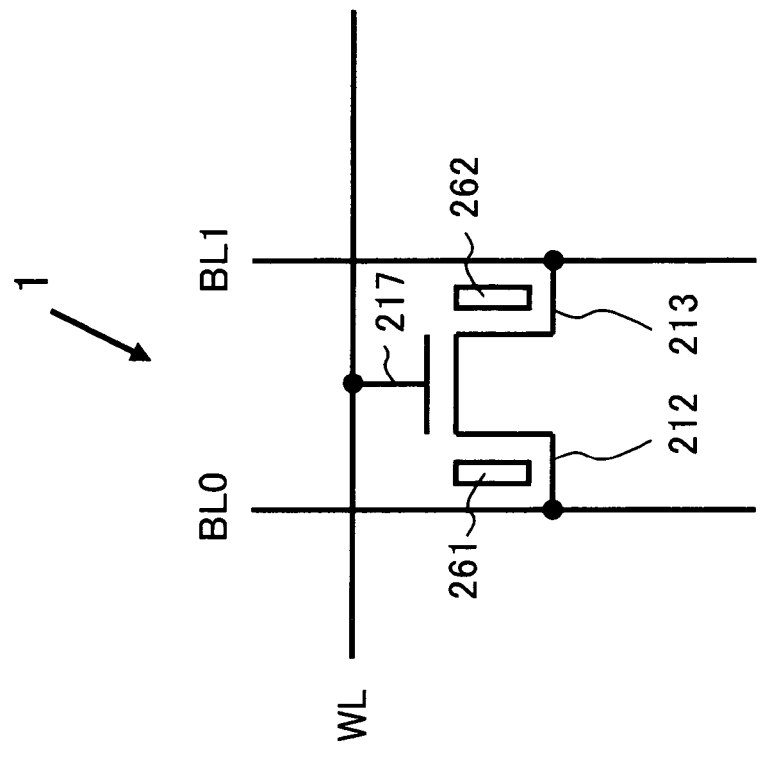
FIG. 3 illustrates a cross sectional view of the structure of a sidewall type memory cell in the nonvolatile semiconductor memory device according to the present invention and its symbolic diagram.
Figure 3A:
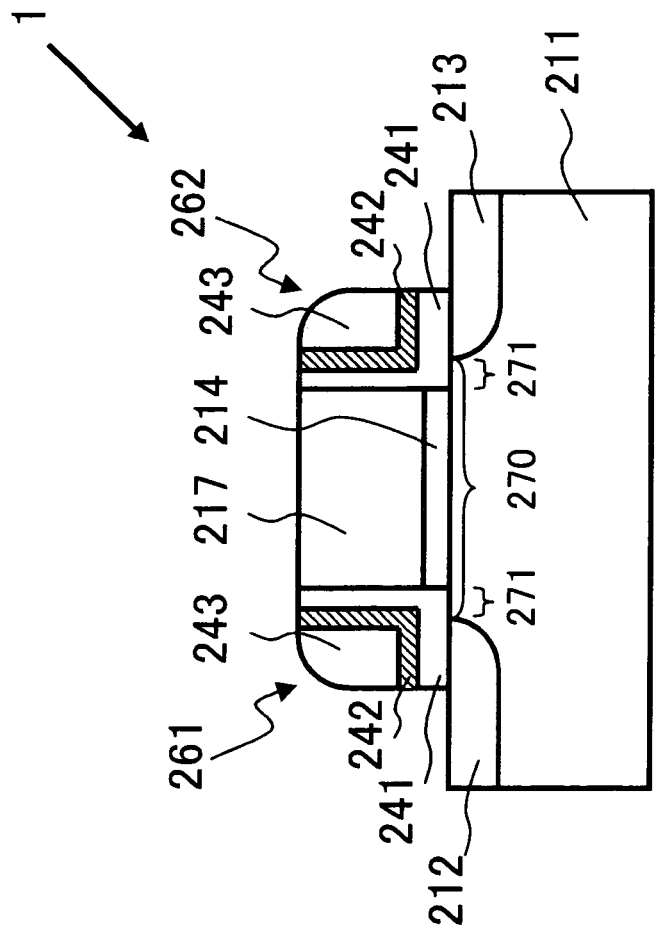

FIG. 2 illustrates a part of the arrangement constitution of memory cells 1 in each sector 101 of the memory cell array 100. The memory cell 1 comprises, as shown in FIG. 3A, a gate electrode 217 formed over a P-type semiconductor layer 211 via a gate insulating film 214, a channel region 270 disposed below the gate electrode 217, N-type diffusion regions 212 and 213 disposed on both sides of the channel region 270 and having a conductive type opposite to that of the channel region 270, and two memory functional elements 261 and 262 formed on both sides or the other side of the gate electrode 217 and having the function of retaining charges.

The N-type diffused regions 212 and 213 are arranged to act one as the drain electrode and the other as the source electrode. The assignment of the two diffused regions 212 and 213 to the drain electrode and the source electrode or vice versa is variable as depending on which of the memory sections 261 and 262 is to be read or programmed. FIG. 3B illustrates a circuit of the memory cell 1 using dedicated symbols. As shown in FIGS. 2 and 3, any two adjacent memory cells 1 along a row share either the diffused region 212 or 213. The memory cells 1 along each row are connected at the gate electrode 217 to a common word line WL and at the two diffused regions 212 and 213 to a first common bit line BL0 and a second common bit line BL1 respectively.

As apparent from FIG. 1, four groups 111, 112, 113, and 114 of the bit lines extend out from their respective sectors 101 of the memory cell array 100. In an erasing action, the column decoder 103 is selectively connected to the first and second common bit lines of one or more of the sectors determined by the sector selecting circuit 105. It is now noted for ease of the description that the bit line groups 111, 112, 113, and 114 extend from the first sector 101a, the second sector 101b, the third sector 101c, and the fourth sector 101d respectively.

The control circuit 102 is arranged to separately control the actions of the column decoder 103, the row decoder 104, the sector selecting circuit 105, the first and second erase voltage applying circuits 106 and 107, the current supplying capacity detecting circuit 108, and the erase verifying circuit 109, thus determining a series of erasing sequence including the erasing action and the verifying action of memory cell array 100. In FIG. 1, the control signal delivered from the control circuit 102 to each component is denoted by the broken line.

The first erase voltage applying circuit 106 is a charge pump circuit for applying a positive voltage (for example, +5 V) to the bit line group determined by the sector selecting circuit 105 and the column decoder 103. The second erase voltage applying circuit 107 is a negative voltage generator circuit for applying a negative voltage (for example, −5 V) to all the gate electrodes of the memory cells 1 connected to the word lines 120 of the memory cell array 100. In the erasing action, the work lines 120 are selectively connected by the action of the row decoder 104.

The current supplying capacity detecting circuit 108 in this embodiment may be a current mirror type differential amplifier circuit for measuring the current supplying capacity of the first erase voltage applying circuit 106 from a source voltage Vdd received by the first erase voltage applying circuit 106. More specifically, the differential amplifier circuit receives at one input the source voltage Vdd or its multiplication by a voltage dividing ratio and at the other input a (fixed) reference voltage for the source voltage to be measured or its multiplication by the same voltage dividing ratio for comparison. When the source voltage Vdd is higher than the reference voltage, it is judged that the current supplying capacity of the first erase voltage applying circuit 106 is as high as sufficient. When the source voltage Vdd is not higher than the reference voltage, it is judged that the current supplying capacity of the first erase voltage applying circuit 106 is as low as not sufficient.

The number of the sectors determined collectively by the sector selecting circuit 105 largely depends on the current supplying capacity of the first erase voltage applying circuit 106 which supplies the diffused regions of each memory cell in the selected sectors with a positive voltage from the bit line groups. The sector selecting circuit 105 is responsive to an output of the current supplying capacity detecting circuit 108 for adjusting the number of the sectors to be selected collectively. The higher the number of sectors divided from a unit memory cell, the more the freedom will be increased for adjustably determining the number of the sectors in response to a variable level of the current supplying capacity. Although the number of sectors is four for ease of the description of the embodiment, it will preferably be five or more for the above described reason.

The erase verifying circuit 109 is arranged for releasing internal address signals in a sequence to the column decoder 103 and the row decoder 104 in each sector 101, reading the corresponding data from the memory cells in the sector 101, examining whether or not each of the memory cells is at its erased state, and judging that the sector 101 is erased when all the memory cells are at their erased state or that the sector 101 is not erased when all the memory cells are not at their erased state. When judging that the sector 101 is not erased, the erase verifying circuit 109 provides the corresponding location in the internal register 110 with a flag indicative of the sector at the not erased state. The erase verifying circuit 109 includes a known readout circuit which is commonly used in a typical nonvolatile semiconductor memory device. The internal register 110 comprises the same number of registers as of the sectors for saving the erased/not erased state data. Each register in the internal register 110 holds the flags as the sector state data.

Then, the action of each component in the inventive device for conducting sequential steps of erasing the memory cell array 100 will be explained. The steps of the action are controlled by the control circuit 102. The erasing action is dedicated to erase the storage data with an erasing voltage applied to each memory cell and includes non of the attribute steps, such as a verifying step of examining whether each of the memory cells is erased or not.

Figure 4:
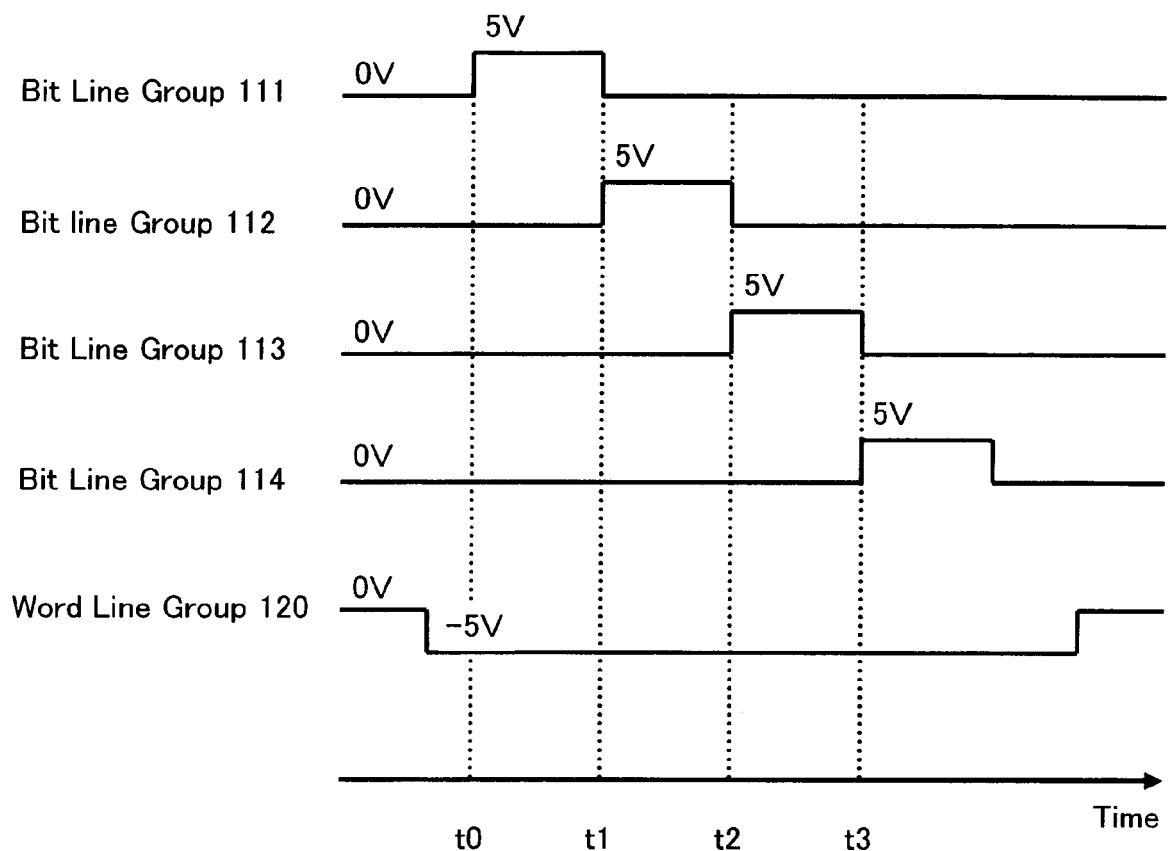
FIG. 4 is a timing waveform diagram showing profiles of the voltage waveforms applied to the bit line groups and the word lines during the erasing action of the nonvolatile semiconductor memory device according to the present invention.

The action starts with the row decoder 104 supplying the word lines 120 with a negative voltage received from the second erase voltage applying circuit 107. The bit line groups 111 to 114 are sequentially selected by the action of the column decoder 103 and each memory cell in the sector 101 is applied to the source electrode and the drain electrode (the N-type diffused regions) with a (positive) high-level voltage received from the first erase voltage applying circuit 106. More specifically, as an erase voltage pulse having a predetermined length of pulse width is applied to between the gate electrode and the source/drain electrodes in each memory cell, the erasing action is conducted at the memory cell. The bit line groups of not selected sectors remain applied not with the high-level voltage but with a low level or 0 V or remain at the floating state, thus permitting no erasing action. For example, when the first sector 101a is selected by the sector selecting circuit 105, its bit line group 111 is selectively applied with a high-level voltage to erase all the memory cells in the first sector 101a. Then, the selection of the bit line group 111 is canceled and the bit line group 112 is applied with the high-level voltage for erasing all the memory cells in the second sector 101b. Similarly, after the erasing action for the third sector 101c and the fourth sector 101d is completed, the negative voltage applied to the word lines 120 is turned to 0 V. FIG. 4 illustrates the relationship between the voltage waveform and the timing of the erasing action at the bit line groups 111 to 114.

Figure 5:
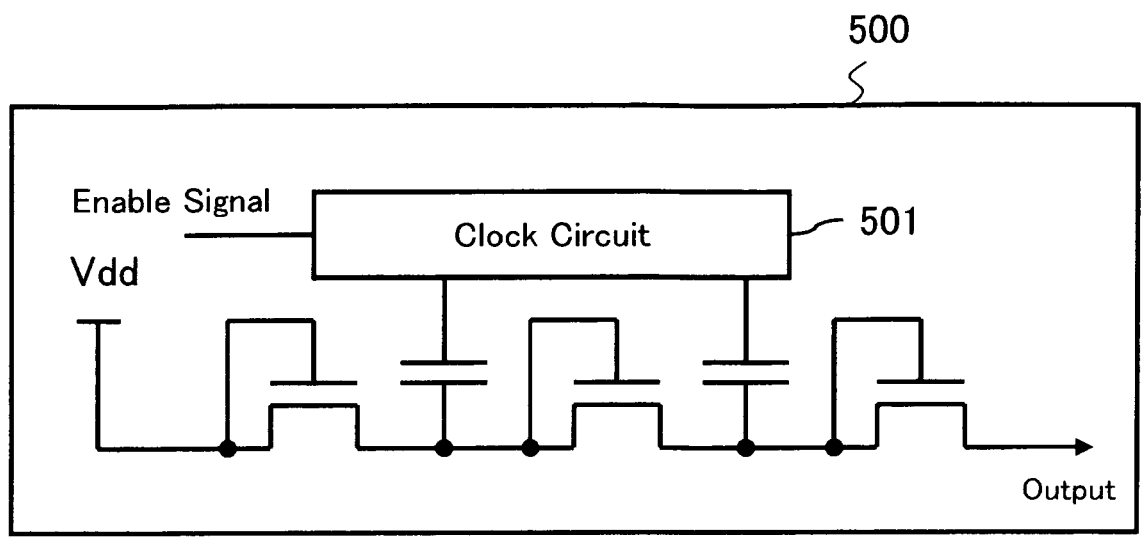
FIG. 5 is a circuitry diagram showing the arrangement of a typical charge pump circuit.

The charge pump in the first erase voltage applying circuit 106 is varied at its output current depending on a change in the source voltage Vdd. For explaining that variation, a typical charge pump circuit 500 is introduced as its circuitry arrangement is illustrated in FIG. 5. Generally, the charge pump circuit 500 delivers as its current output a charge accumulated in the capacitor in synchronization with a clock frequency determined by its clock circuit 501. The charge $\Delta Q$ accumulated in the capacitor having a capacitance C and a potential difference $\Delta V$ is expressed by $$\Delta Q = C \times \Delta V \tag{1}$$

As apparent from the equation (1), the charge accumulated in the capacitor is proportional to the potential difference. When the source voltage of the inventive device ranges from 1.8 V to 3.6 V, the charge will be 1.8 C at minimum and 3.6 C at maximum. The current supplying capacity hence may be doubled in the difference. Also, the clock frequency from the clock circuit 501 in the charge pump circuit 500 sharply soars as the source voltage is increased. In total, the current supplying capacity of the charge pump circuit will be varied up to substantially three times greater. When the source voltage Vdd received by the first erase voltage applying circuit 106 is rather high, the collective erasing of data over two or more of the sectors 101 will be possible. It is preferable to set the reference voltage to an intermediate level, namely 2.7 V, when the source voltage ranges from 1.8 V to 3.6 V.

Figure 6:
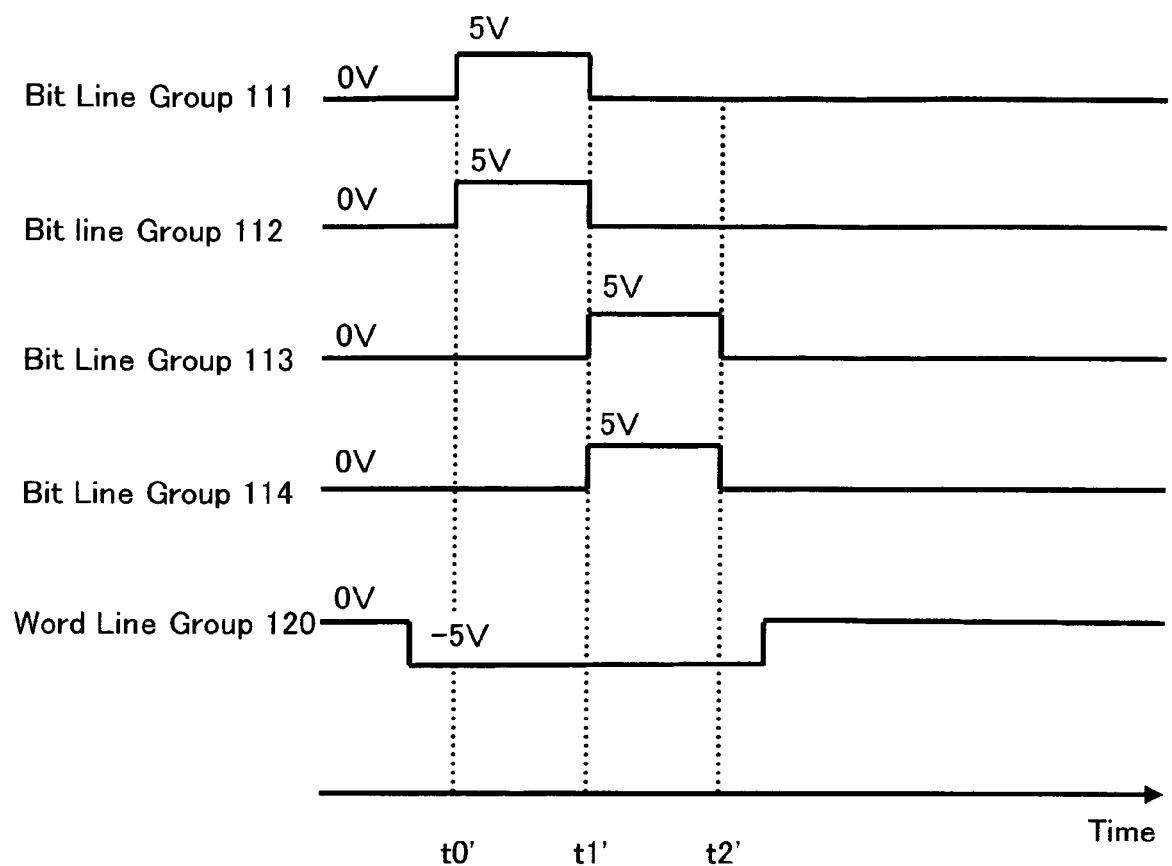
FIG. 6 is a timing waveform diagram showing another profiles of the voltage waveforms applied to the bit line groups and the word lines during the erasing action of the nonvolatile semiconductor memory device according to the present invention.

The erasing action will be explained when the source voltage Vdd is high. When the source voltage Vdd exceeds the reference voltage level, the current supplying capacity detecting circuit 108 delivers a high source voltage detection signal 115 to the sector selecting circuit 105. When receiving the high source voltage detection signal, the sector selecting circuit 105 shifts the number of the sectors to be selected collectively from four to two; the sectors 101 can thus be selected two by two in a sequence. FIG. 6 illustrates the relationship between the voltage waveform and the timing of the erasing action at the bit line groups 111 to 114 and the word lines 120 when the high source voltage detection signal is received.

The action starts with the column decoder 104 supplying the word lines 120 with a negative voltage received from the second erase voltage applying circuit 107. The sector selecting circuit 105 then selects the first and second sectors 101a and 101b, collectively allowing the column decoder 103 to select the bit line groups 111 and 112. The bit line groups 111 and 112 are applied continuously for a predetermined length of time with the (positive) high-level voltage supplied from the first erased voltage applying circuit 106 to conduct the erasing action over the first and second sectors 101a and 101b. When the erasing action over the first and second sectors 101a and 101b has been finished, the sector selecting circuit 105 selects the third and fourth sectors 101c and 101d, collectively allowing the column decoder 103 to select the bit line groups 113 and 114. The bit line groups 113 and 114 are applied similarly for a predetermined length of time with the (positive) high-level voltage supplied from the first erased voltage applying circuit 106 to conduct the erasing action over the third and fourth sectors 101c and 101d. When the erasing action over all the four sectors 101a to 101d in the memory cell array 100 has been completed with the application of erase voltage pulses, the word lines 120 are shifted from the negative voltage to 0 V.

As clearly understood from the description, the memory cell array 100 as a minimum unit to be erased is divided into sectors 101 and subjected to the time-division erasing action. Accordingly, the memory cell array 100 in the sidewall memory which requires a large erasing current per memory cell can readily be erased. Also, the number of the sectors or memory cells to be erased at once is varied depending on the current supplying capacity of the first erase voltage applying circuit 106. As a result, when the source voltage is high, the erasing action will be carried out at higher speed and efficiency.

The duration of time for entirely erasing the memory cell array 100 will be explained. The duration for erasing each block in a conventional NOR flash memory is typically about 500 ms. As described previously, the pre- and post-conditioning processes in addition to other troublesome processes are necessary for eliminating the over-erasing action in the NOR flash memory. Since the sidewall memory theoretically allows no over-erasing, its erasing action may simply include an erasing pulse application step (a data erasing step) and a verifying step. However, as the memory cells in the memory cell array 100 fail to be erased at once, the number of the sectors to be erased at once with the current output of the first erase voltage applying circuit 106 will be varied. Hence, the duration of time for erasing will largely depend on the number of the sectors because pulses of the erase voltage are applied in a sequence.

It is now assumed that the memory cell array 100 consists mainly of 200 sectors but not 4 sectors shown in FIG. 1 and the first erase voltage applying circuit 106 produces the current supplying capacity for erasing four sectors at once among the 200 sectors. As the pulse width of the erase voltage is 1 ms in the sidewall memory, the duration of time for entirely erasing the memory cell array 100 will last 50 ms. The flash memory takes some milliseconds for carrying out the erasing action, it will be shorter in particularly the duration of one erasing action than the sidewall memory. In case that each memory cell is erased through a single action of applying the erase voltage pulse, the pre- and post-conditioning processes will be unnecessary. Accordingly, the memory cell array 100 can be erased within substantially 100 ms of the duration, hence making the total duration for the erasing action shorter than that of the flash memory.

However, as some memory cells remain not erased by a single action of applying the erase voltage pulse, the application of the erase voltage pulse has to be repeated. When the number of repeating actions is not small, the overall duration of the erasing action will be longer than that of the flash memory.

The action of the inventive device for repeating the erasing step will be described referring to FIG. 1 and FIGS. 7A to 7C. It is now assumed that the memory cell array 100 is divided into 200 sectors.

Figure 7A:
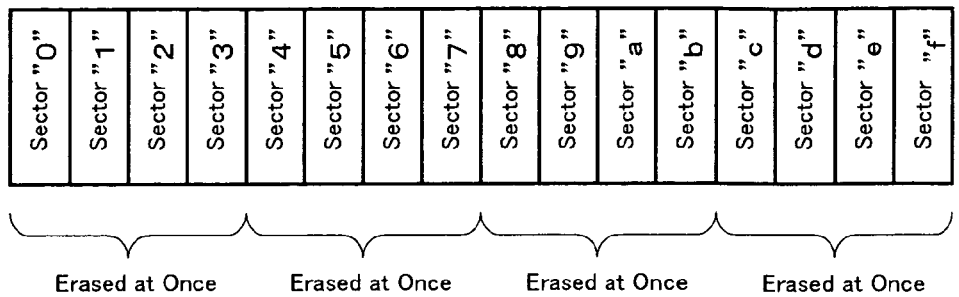
FIG. 7 is a diagram explaining an example of the selection of sectors in a series of the erasing sequential actions of the nonvolatile semiconductor memory device according to the present invention.
Figure 7B:
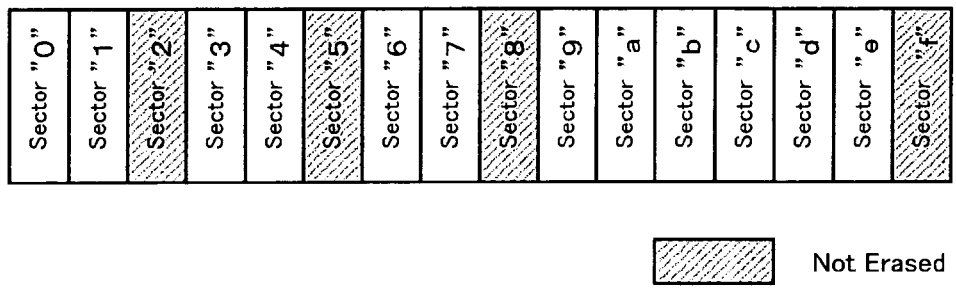

For ease of the description, 16 sectors only among the 200 sectors in the memory cell array 100 are shown in FIGS. 7A and 7B. The 16 sectors are divided into groups, 0 to 3, 4 to 7, 8 to b, and c to f, which can be erased at once by the erase voltage pulse. In other words, the 16 sectors shown in FIG. 7A can be erased by four times of the application of the erase voltage pulse. After each group of the sectors is applied with the erase voltage pulse, the verifying action of the erase verifying circuit 109 follows. It is then assumed after the first application of the erase voltage pulse that some memory cells remain not erased in the sectors 2, 5, 8, and f as shown in FIG. 7B. The not erased sectors 2, 5, 8, and f are registered with their respective flags in the internal register 110. The erase action has to be repeated for entirely erasing the memory array cell 100 because some memory cells remain not erased. For example, when all the four groups of the sectors are applied repeatedly with two application of the erase voltage pulse, the total of eight applications of the erase voltage pulse will be needed thus increasing the duration of the erasing action to two times greater.

Figure 7C:
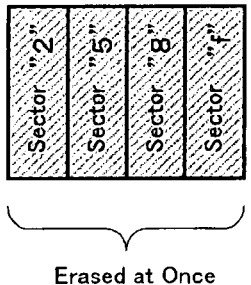

For preventing the duration of the erasing action from being increased by the repeated applications after the second time, the inventive device allows four of the not erased sectors to be grouped by reviewing the not erased sector flags stored in the internal register 110, as shown in FIG. 7C, and thus be applied at once with the erase voltage pulse. More particularly, the four sectors 2, 5, 8, and f to be subjected again to the erasing action are combined to one group which is then applied with the erase voltage pulse. As compared with the prior art having to repeat the application of the erase voltage pulse four times, the inventive device simply repeats the application of the erase voltage pulse once. The total number of applications of the erase voltage pulse is then five: four times of the initial application and one time of the repeated application. Accordingly, the erasing action can hence be speeded up as its duration is reduced to ⅝. Also, since the erased sectors need not to be applied again with the erase voltage pulse, the current supplying capacity of the first erase voltage applying circuit 106 which has a limitation can be used more efficiently.

The erasing action of the inventive device including the repeating steps will be explained in a sequence of steps referring to a flowchart of FIG. 8.

The action starts with the current supplying capacity detecting circuit 108 measuring the source voltage Vdd to examine the current supplying capacity of the first erase voltage applying circuit 106 (S1). Then, the sector selecting circuit 105 determines from a result of the measurement the number n of sectors to be erased at once (S2). When groups of the sectors are selected by the sector selecting circuit 105 (S3), their memory cells are applied with the erase voltage pulse supplied from the first 106 and the second erase voltage applying circuit 107 for conducting the erasing action (S4). The initial selecting action at S3 is carried out with a default of the front sector N in the group being set to 1 so that the n sectors starting from the front sector N are selectively grouped to be erased at once.

This is followed by the erase verifying circuit 109 verifying the erased sectors (S5) and examining whether not erased sectors remain or not (S6). When a not erased sector is present, a flag indicative of the presence of not erased sector is applied at the corresponding location in the internal register 110 (S7). It is then examined whether or not each selected group of the sectors contains the last sector (S8). When the last sector is not present, the front sector N is replaced by the sector N+n which is determined through adding the front sector number N with the number n of sectors to be erased (S9). Then, the steps S3 to S8 are repeated until the final sector is found in the selected groups or all the sectors to be erased have been selected.

The steps S6 and S7 involve detection of not erased sectors and setting of the flag. The repeat action of erasing the not erased sectors is not conducted between the initial erasing process and the verifying process.

When all the sectors to be erased have been selected and the initial erasing action is completed, the action moves to S8 to S10 for repeating the erasing action.

Then, the internal register 110 is examined whether it contains not erased flags or not (S10). When not erased flags are not present, it is judged that all the sectors have been erased and the action is closed. When one or more not erased flags are present, the sector selecting circuit 105 combines the not erased sectors defined by the not erased flags into a group (S11). The group of the not erased sectors is then selected to be erased (S12) and its memory cells are applied with the erase voltage pulse supplied from the first 106 and the second erase voltage applying circuit 107 for repeating the erasing action (S13). The number of the sectors to be erased at once is limited at the second time of the erasing action, similar to the first time of the erasing action. The number of the sectors to be erased is then determined at the step S11 so as not to exceed the number n of the sectors determined at the step S2. More specifically, the not erased sectors defined by the not erased flags in the internal register 110 are picked up from the smallest number and summed up to n. The last sector is then numbered with M and stored.

Then, the verifying process of the erase verifying circuit 109 for the sectors erased at the second time is conducted equal to the first time of the erasing action (S14), and then, determination is made whether an unerased sector is present or not (S15). When one or more not erased sectors are still present, their flags are applied at the corresponding location in the internal register 110 (S16). More particularly, when some not erased flags have been stored in the internal register 110, they remain intact and reset only when their defining not erased sectors are terminated. It is then examined whether or not the last of the not erased sectors is present in the selected group (S17). When not, the sector M+1 which is numbered higher by one than the last sector M in the selected group is assigned as the front sector defined for searching the not erased sectors (S18). Then, the steps S11 to S17 are repeated until the final sector is found in the selected groups or all the not erased sectors have been selected.

When it is judged at S17 that the last of the not erased sectors is present in the selected group and the second erasing action is closed, the action returns back to the step S10 for repeating to search other not erased sectors. When no more of the not erased flags are found, it is judged that all the sectors have been erased and the action is closed. When one or more of the not erased flags are still found, the steps from S11 to S18 are repeated for conducting the third erasing action equal to the second action. When all the sectors in the memory cell array are erased, the action is perfectly closed.

The action of the inventive device will be described in more detail referring to a circuitry diagram of FIG. 9.

Figure 9:
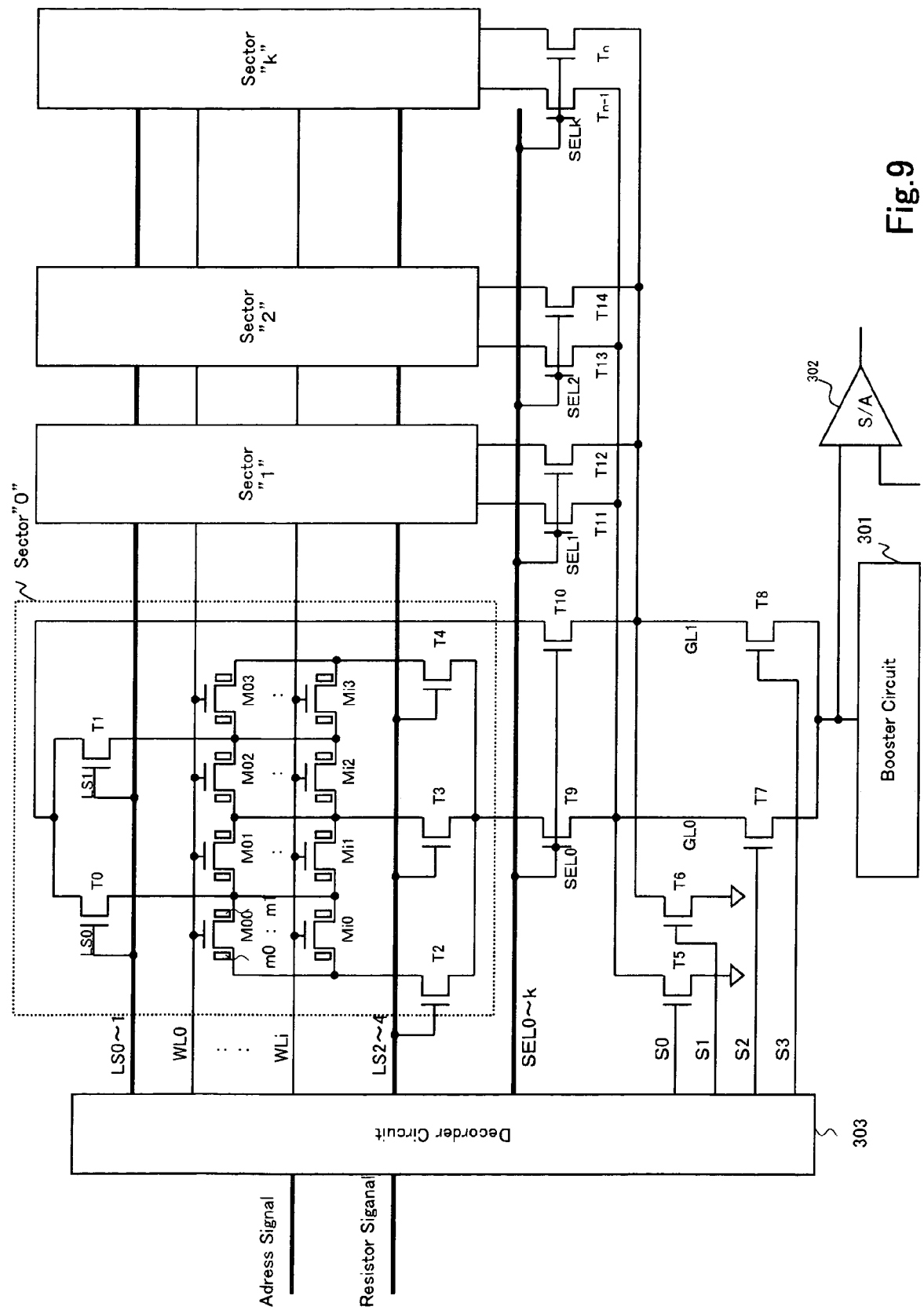
FIG. 9 is a circuit block diagram showing a memory cell array and its peripheral circuitry arrangement in the nonvolatile semiconductor memory device according to the present invention.

FIG. 9 illustrates a series of sectors, 0 to k, in a memory cell array, each sector to be erased at once comprising sidewall type memory cells M00 to Mi3 and column selecting transistors T0 to T4. The sectors 0 to k are selected by their respective sector selecting transistors T9 to Tn. The selecting transistors T5 to T8 are connected via a node GL0 to the first bit line BL0 and via a node GL1 to the second bit line BL1 for controllably assigning the two bit lines as a bit line and a source line. When each memory cell is selected for the program action or readout action, its diffused region connected with the bit line acts as the drain electrode and its diffused region connected with the source line acts as the source electrode. The assignment of the first bit line BL0 and the second bit line BL1 to the bit line and the source line or vice versa depends on which of the memory sections in the selected memory cell is to be subjected to the program action or the readout action.

The selecting transistors T7 and T8 are connected at the source to a sense amplifier 302 and a booster circuit 301. The actions of the column selecting transistors T0 to T4, the sector selecting transistors T9 to Tn, and the selecting transistors T5 to T8 all are controlled by a decoder circuit 303. The booster circuit 301 is equivalent to the first erase voltage applying circuit 106 shown in FIG. 1 and the sense amplifier 302 serves as a part of the erase verifying circuit 109 shown in FIG. 1. The decoder circuit 303 includes the column decoder 103 and the row decoder 104 shown in FIG. 1.

The action of controlling the program action over the memory cell will be explained. It is now assumed that the left memory section m0 of the memory cell M00 in the sector 0 is subjected to the program action. Accordingly, the diffusion region in the memory section m0 acts as the drain electrode, the first bit line BL0 acts as the bit line, the opposite diffused region acts as the source electrode, and the second bit line acts as the source line.

The action starts with applying a program voltage (for example, +5 V) to the word line WL0 and activating the booster circuit 301 for producing an output of 5 V. Then, while the selecting transistors T5 and T8 are turned off, the selecting transistor TG and T7 are turned on. At the time, the node GL0 is at 5 V and the node GL1 is at 0 V. When the sector selecting transistors T9 and T10 and the column selecting transistors T2, T0, and T1 are turned on, the drain electrode of the memory cell M00 is applied with 5 V of the voltage supplied via the first bit line BL0 from the booster circuit 301. The source electrode is connected to the grounding voltage of 0 V by the action of the selecting transistor T6. As there is developed a potential difference between the source and the drain with the word line WL0 applied with 5 V, channel hot electrons are produced and introduced into the left memory section m0 of the memory cell M00. This increases the threshold voltage with the diffused region at the memory section m0 assigned as the drain electrode and the opposite diffused region at the other section m1 assigned as the source electrode, thus programming the memory section m0. For programming the right memory section m1 of the memory cell M00, the assignment of the two diffused regions to the source and the drain is inverted in the memory cell M00. Then, the transistors are turned on and off so that the node GL0 is at 0 V and the node GL1 is at 5 V.

For starting the erasing action, the word lines WL0 to WLi are applied with a negative voltage. While the selecting transistors T5 and T6 remain turned off, the column transistors T0 to T4 and the sector selecting transistors T7 to T10 are turned on. As a result, the output of 5 V from the booster circuit 301 is applied to the source and drain electrodes of each of the memory cells M00 to Mi3 in the sector 0, erasing data in both the left and right memory sections of each of the memory cells M00 to Mi3.

The selection of the sectors to be read, programmed, or erased is controlled with sector control signals SEL0 to SELk. The sector control signals SEL0 to SELk are received by the gates of the corresponding sector selecting transistors T9 to Tn, each pair of the transistors assigned to one sector as shown in FIG. 9. For the readout or program action, the sector control signals SEL0 to SELk are enabled by the decode output of address signal. For the erasing action, the sectors to be erased have to be identified as one group. Particularly when not erased sectors remains, the erasing action has to be repeated two or more times. For the purpose, the decoder circuit 303 is arranged to receive register output signals released from the internal register 110 (See FIG. 1) and selected by the sector selecting circuit 105. The selected register output signals are control signals for selecting the not erased sectors as released from the sector selecting circuit 105 shown in FIG. 1. More specifically, as each group of the sectors to be erased at once is determined by the sector selecting circuit 105, a sequence the steps for carrying out the erasing action shown in the flowchart of FIG. 8 can be implemented with equal success.

As set forth above, the inventive device and its sequential steps for carrying out the erasing action together with the verifying process are clearly understood. However, the present invention is not limited to the inventive device having the foregoing memory cell array.

Although the sidewall type memory cell described above consists of two memory sections at the multi-bit mode, it may be implemented by a single memory section.

The circuitry arrangement in the embodiment allows the current supplying capacity of the first erase voltage applying circuit 106 to be determined according to the source voltage for application of a positive high-level voltage to the bit lines of each memory cell array. The current supplying capacity is not limited to the manner of measurement in the embodiment. Also, the current supplying capacity in the embodiment is measured in two stages. The measurement of the current supplying capacity is not limited to two stages but may be conducted in three or more stages.

Figure 8:
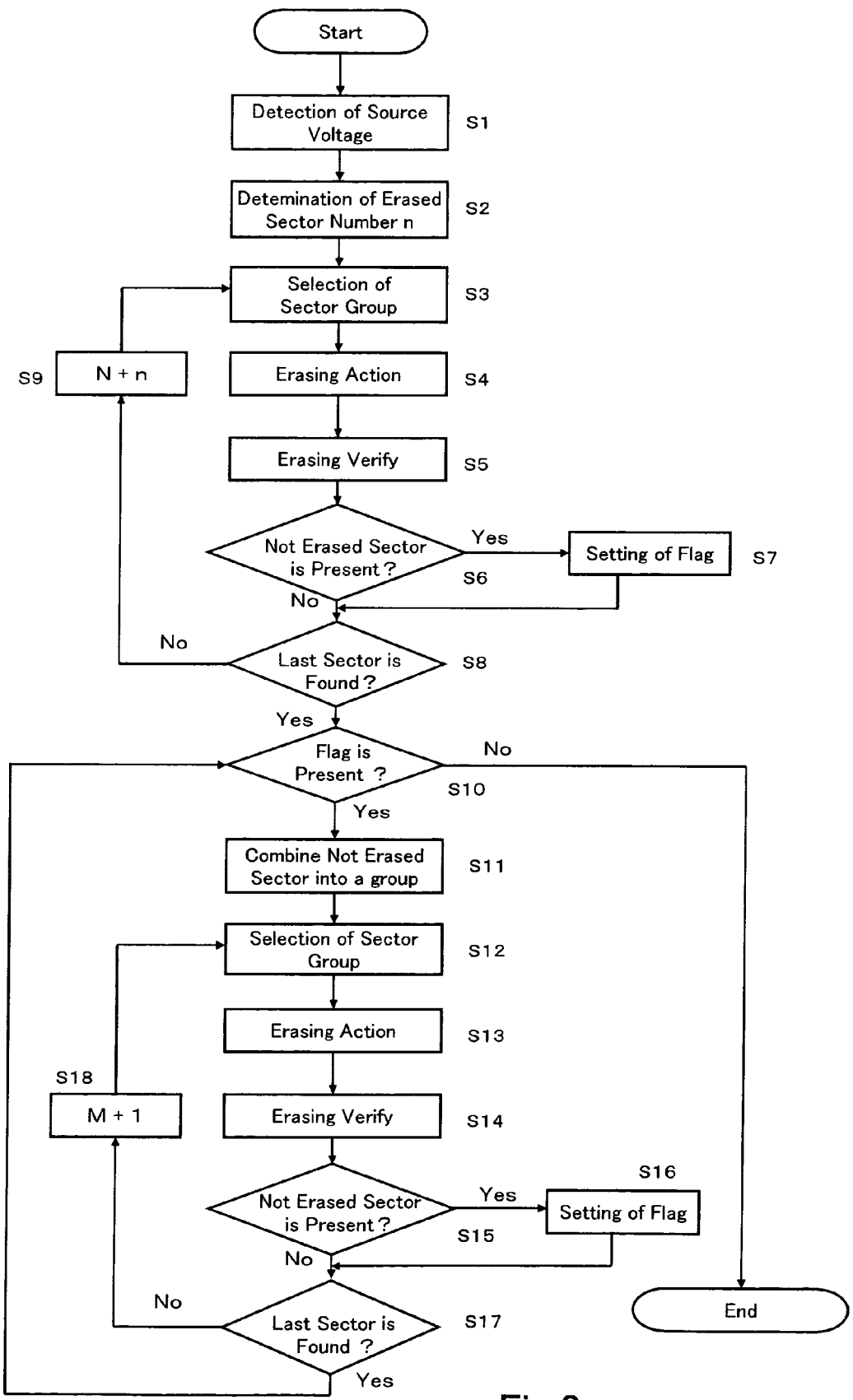
FIG. 8 is a flowchart showing a series of the erasing sequential actions of the nonvolatile semiconductor memory device according to the present invention, including a repeat of the erasing action.

According to the present invention, the sequential steps of the inventive device for carrying out the erasing action together with the verifying process are clearly understood as described with the flowchart of FIG. 8. The sequential steps for carrying out the erasing action is not limited to the steps shown in the flowchart of FIG. 8. The flowchart of FIG. 8 conducts the verifying process whenever the initial erasing action has been completed over groups of the n sectors. The verifying process may be carried out with equal success when all the sectors to be erased have been subjected to one or more repeated actions of the erasing process.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
    a plurality of memory cell arrays, each memory cell array divided into sectors;
    a sector selecting circuit for, when one of the memory cell arrays is to be erased collectively, sequentially selecting a predetermined number of the sectors at a time from the memory cell array to be erased; and
    an erase voltage applying circuit for, when the collective erasing is carried out, applying a predetermined level of erasing voltage to the sectors selected by the sector selecting circuit, wherein
    the memory cell array has a plurality of a memory cells arranged in rows and columns,
    each memory cell comprises a gate electrode over a semiconductor layer with an intervening gate insulating film, a channel region disposed below the gate electrode, diffusion regions disposed on both sides of the channel region and having a conductive type opposite to that of the channel region, and a memory functional element on both or one side of the gate electrode and having a function of retaining charge; and
    a current supplying capacity detecting circuit for measuring a current supplying capacity of the erase voltage applying circuit, wherein
    the sector selecting circuit is arranged so that a maximum number of the sectors selectable at a time is variable corresponding to the current supplying capacity measured by the current supplying capacity detecting circuit.

2. A nonvolatile semiconductor memory device according to claim 1, wherein
    the current supplying capacity detecting circuit is arranged to measure the current supplying capacity from the source voltage received by the erase voltage generating circuit.

3. The nonvolatile semiconductor memory device according to claim 1, wherein
    the sector selecting circuit is arranged to select a number of the sectors at a time in response to an address signal or an output signal from an internal register.

4. The nonvolatile semiconductor memory device according to claim 1, wherein
    the memory cell array is divided into sectors equal in size.

5. The nonvolatile semiconductor memory device according to claim 1, further comprising:
    an erase verifying circuit for determining whether all the memory cells have been erased in each selected sector applied with the predetermined level of erasing voltage, wherein
    when one or more sectors in which one or more of the memory cells remains unerased is detected by the erase verifying circuit, the sector selecting circuit sequentially selects at most the predetermined number of the unerased sectors at a time and then the erase voltage applying circuit applies the predetermined level of erasing voltage to each group of the unerased sectors selected at a time by the sector selecting circuit.

6. The nonvolatile semiconductor memory device according to claim 5, wherein
    the erase verifying circuit is arranged to conduct its verifying action over the unerased sectors which have been applied with the predetermined level of erasing voltage from the erase voltage applying circuit.

7. The nonvolatile semiconductor memory device according to claim 5, further comprising:
    an internal register for storing a result of the verifying action over each sector, wherein
    the erase verifying circuit is arranged to store the result of the verifying action over each sector in the corresponding location in the internal register, and
    the sector selecting circuit is arranged to select the unerased sectors in response to an output of the internal register.

8. A method of operating a nonvolatile semiconductor memory device having a plurality of memory cell arrays, each memory cell array being arranged in rows and columns and divided into sectors, each memory cell comprising a gate electrode over a semiconductor layer with an intervening gate insulating film, a channel region disposed below the gate electrode, diffusion regions disposed on both sides of the channel region and having a conductivity type opposite to that of the channel region, and a memory functional element on both or one side of the gate electrode and having a function of retaining charge, the method comprising:
    when one of the memory cell arrays is to be erased collectively, sequentially selecting a predetermined number of the sectors at a time from the memory cell array to be erased;
    applying a predetermined level of erasing voltage to the selected selectors when the collective erasing is carried out;
    measuring a current supplying capacity of a circuit which applies the predetermined level of erasing voltage; and
    varying a maximum number of the sectors selectable at a time, corresponding to the measured current supplying capacity.

* * * * *